(12) United States Patent
Apodaca et al.

(10) Patent No.: US 8,455,298 B2
(45) Date of Patent: Jun. 4, 2013

(54) METHOD FOR FORMING SELF-ALIGNED PHASE-CHANGE SEMICONDUCTOR DIODE MEMORY

(75) Inventors: Mac D. Apodaca, San Jose, CA (US); Ailian Zhao, Boxborough, MA (US); Jenn C. Chow, San Jose, CA (US); Thomas Brown, San Jose, CA (US); Lisa Ceder, Hollister, CA (US)

(73) Assignee: Contour Semiconductor, Inc., Billerica, MA (US)

( * ) Notice: Subject to any disclaimer, the term of this patent is extended or adjusted under 35 U.S.C. 154(b) by 0 days.

(21) Appl. No.: 12/543,086

(22) Filed: Aug. 18, 2009

(65) Prior Publication Data

US 2010/0047995 A1 Feb. 25, 2010

Related U.S. Application Data

(60) Provisional application No. 61/089,625, filed on Aug. 18, 2008.

(51) Int. Cl.
 *H01L 21/06* (2006.01)
(52) U.S. Cl.
 USPC ..... 438/102; 438/430; 438/629; 257/E21.589
(58) Field of Classification Search
 USPC ........ 438/102, 103, 429, 430, 692, 629; 257/E21.589
 See application file for complete search history.

(56) References Cited

U.S. PATENT DOCUMENTS

| 4,321,661 | A | 3/1982 | Sano |
| 5,889,694 | A | 3/1999 | Shepard |
| 6,198,645 | B1 | 3/2001 | Kotowski et al. |
| 6,306,740 | B1 | 10/2001 | Hattori |
| 6,586,327 | B2 | 7/2003 | Shepard |
| 6,861,694 | B2 * | 3/2005 | Nakamura ............... 257/306 |
| 6,952,030 | B2 * | 10/2005 | Herner et al. .......... 257/313 |
| 7,728,318 | B2 * | 6/2010 | Raghuram et al. ......... 257/2 |
| 8,022,381 | B2 | 9/2011 | Toda .......................... 257/2 |
| 8,148,230 | B2 * | 4/2012 | Dunton et al. ............ 438/385 |
| 2003/0016553 | A1 | 1/2003 | Subramanian et al. |
| 2006/0062043 | A1 | 3/2006 | Roehr et al. |
| 2007/0034921 | A1 | 2/2007 | Daley et al. |
| 2008/0078984 | A1 * | 4/2008 | Park et al. ................... 257/4 |
| 2008/0116441 | A1 * | 5/2008 | Raghuram et al. ......... 257/4 |
| 2008/0175032 | A1 | 7/2008 | Tanaka et al. |
| 2008/0197334 | A1 * | 8/2008 | Lung .......................... 257/2 |
| 2009/0001337 | A1 | 1/2009 | Furukawa et al. |
| 2009/0261313 | A1 * | 10/2009 | Lung et al. ................. 257/4 |

FOREIGN PATENT DOCUMENTS

| EP | 0479450 A2 | 4/1992 |
| EP | 1261024 A2 | 11/2002 |
| EP | 1300868 A2 | 4/2003 |
| EP | 1426942 A2 | 6/2004 |
| WO | WO-2008030351 A2 | 3/2008 |

OTHER PUBLICATIONS

International Search Report and Written Opinion for PCT/US2008/087652, mailed on Mar. 27, 2009.
Partial International Search, PCT/US2009/069899, dated Apr. 9, 2010, 3 pages.
Communication Relating to the Results of the Partial International Search, filed in PCT/US2010/026775, dated Jun. 14, 2010, 4 pages.
International Search Report and Written Opinion for PCT/US2009/069899, dated Mar. 19, 2010, 17 pages.

* cited by examiner

*Primary Examiner* — Tuan N. Quach
(74) *Attorney, Agent, or Firm* — Bingham McCutchen LLP

(57) ABSTRACT

A method for fabricating a memory device includes depositing a phase-change and/or a resistive change material. The memory device is formed photolithographically using sixteen or fewer masks.

18 Claims, 7 Drawing Sheets

METHOD FOR FORMING SELF-ALIGNED PHASE-CHANGE SEMICONDUCTOR DIODE MEMORY

CROSS-REFERENCE TO RELATED APPLICATIONS

This application claims priority to and the benefit of U.S. Provisional Patent Application Ser. No. 61/089,625, filed on Aug. 18, 2008, which is hereby incorporated herein by reference in its entirety.

TECHNICAL FIELD

The present invention relates, in various embodiments, to the manufacture and processing of semiconductor devices, and, more particularly, to methods for fabricating switching devices for solid-state semiconductor memory applications.

BACKGROUND

In many types of diode-based solid-state memory, each memory element includes a p-n junction diode. A switching device (that includes, for example, a phase-change material) may be combined with the p-n junction diode to create a reversibly switching, re-programmable (i.e., rewritable or read-write) phase-change random-access memory ("PCRAM") element. The switching device is typically formed in a recess adjacent to each p-n junction diode. In the prior art, the recess is formed using a subtractive process wherein at least one film layer is deposited, masked with a lithographic process, and partially removed with chemical etching. A conventional complementary metal-oxide-silicon ("CMOS") based phase-change memory requires sixteen or more masks.

Other PCRAM processes may require even more photomask steps. Each photomask adds to the cost, complexity, time, and likelihood of failure of the overall device processing. A need exists, therefore, for a PCRAM processing method that uses fewer photomask steps and is thus cheaper, simpler, faster, and more robust than existing processes.

SUMMARY OF THE INVENTION

Embodiments of the present invention include processing methods for a PCRAM device that eliminate the need for additional steps, films, and/or lithography in the fabrication of the recesses used for the switching devices required for each PCRAM memory cell. Pillars of a diode material, surrounded by an isolating material, are first formed. A top surface of the pillars is polished, and the self-aligned recesses may be formed thereon by an etch that reacts with the pillars and isolating material at different rates. Once the recesses are formed, a phase-change alloy may be deposited therein and subsequently operate as switching device for a diode in each memory cell. By eliminating unnecessary layers and lithographic processing steps, embodiments of the invention simplify PCRAM processing and render it less expensive.

In general, in a first aspect, embodiments of the invention feature a method for forming a non-volatile rewritable memory device. Pillars of material are formed and surrounded by isolating material, and substantially coplanar top surfaces are formed of the pillars and the isolating material. The pillar material and the isolating material are simultaneously etched, the pillar material being etched at a greater rate than the isolating material to form recesses over the pillars. The recesses are filled and circuit elements that include the filled recesses are formed.

The substantially coplanar top surfaces may be formed by polishing. The pillars and the isolating material may be formed lithographically using fewer than sixteen masks, ten or fewer masks, or eight or fewer masks. The circuit elements may include a non-volatile memory cell, a diode, and/or a via. The step of etching may include or consist of reactive-ion etching, which may include chlorine etching. The pillars of material may include silicon, amorphous silicon, and/or polysilicon. Forming the pillars of material may include epitaxial deposition. The isolating material may include or consist essentially of a dielectric.

In general, in another aspect, embodiments of the invention feature a method for fabricating an electronic device. An array of pillars is formed, and each pillar includes a diode material and is substantially surrounded by an insulating material. The array of pillars is planarized to expose a top surface of each pillar. An upper portion of each pillar is removed to form a recess thereover. A phase-change material is formed within each recess.

Each pillar may include an etch-stop layer, and the step of removing an upper portion of each pillar may include exposing the etch-stop layer. The phase-change material may include a chalcogenide alloy. A spacer may be formed within each recess before forming the phase-change material, and the spacer may include or consist of an insulating material. The diode material may include or consist of silicon.

In general, in another aspect, embodiments of the invention feature a method for fabricating a memory device. The method includes depositing phase-change or resistive-change material, and the memory device is formed lithographically using sixteen or fewer masks. The memory device may also be formed lithographially using ten, eight, or fewer masks.

These and other objects, along with advantages and features of the embodiments of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following enlarged, schematic cross-sections, in which.

DETAILED DESCRIPTION

Embodiments of the present invention reduce the number of films and lithography steps used in the formation of a recess in a PCRAM element. The recess may be formed by first planarizing, e.g., by chemical-mechanical polishing ("CMP"), an insulating layer over a substrate and the diodes (fabricated therein) to create a substantially planar surface. Then, upper portions of the diode material, e.g., silicon or an alloy thereof, are removed by selective etching. Using a selective etch process, the diode material is removed at a faster rate than is the insulating layer, thereby forming a self-aligned recess immediately above and adjacent to the diode. A chalcogenide or other suitable material may then be formed within the recess.

Figure 1:
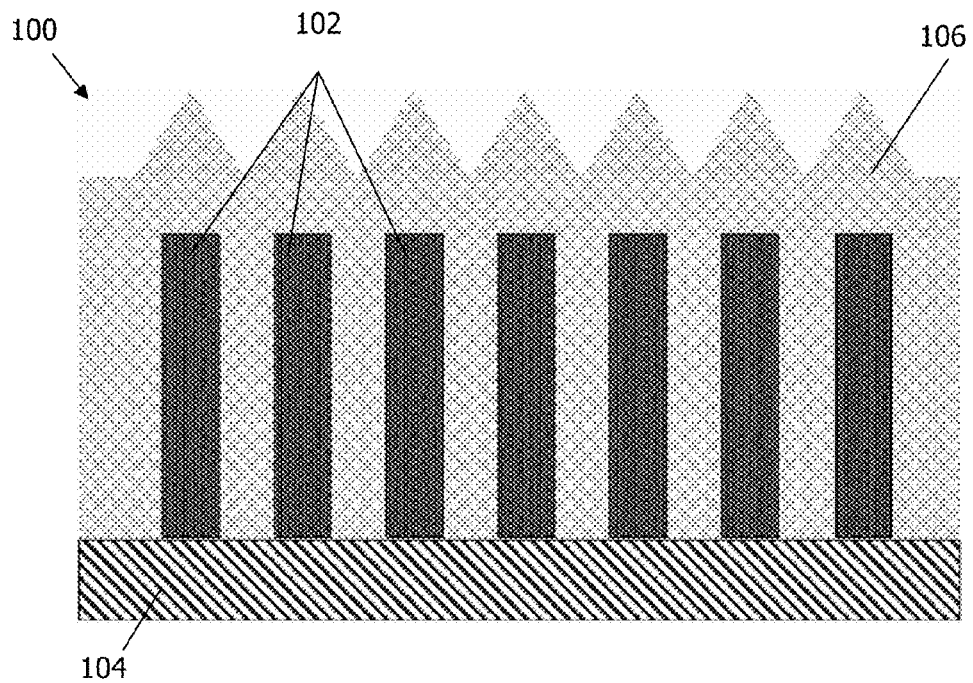
FIG. 1 illustrates the deposition of an isolation layer on pillars.

FIG. 1 illustrates a structure 100 that includes a series of pillars 102 formed on a substrate 104 and separated by an isolating material 106. The pillars 102 may be generally upright structures that are relatively slender in proportion to their height. More generally, the pillars 102 may have any suitable aspect ratio, including those in which their width exceeds their height, and may have any desired cross-section. The pillars 102 are typically formed by photolithographic patterning techniques and chemical etching, such as reactive ion etching ("RIE"). The pillars 102 may be formed of a semiconducting material such as silicon, polysilicon, amorphous silicon, or alloys thereof. The substrate 104 may include or consist of an insulating material, bulk silicon, metal conductors, and/or paths and patterns of other conductive material, such as a doped semiconductor. The isolating material 106, which may be an electrical insulator such as silicon dioxide, is deposited to surround the formed pillars 102. The combination of deposited pillar material and the material in the substrate 104 under a given pillar location may define the electrical characteristics of the pillars 102.

The above-described process (e.g., first forming the pillars 102 and adding the insulating material 106 thereafter) allows the formation of complex pillar structures. For example, the pillars 102 may include epitaxially grown layers to form, e.g., a film stack with complex junction designs.

Figure 2:
FIG. 2 illustrates the planarization process of an isolation layer and pillars.

FIG. 2 illustrates a structure 200 formed by processing (e.g., polishing) a top surface of the structure 100 by, for example, CMP to create a substantially planar top surface 202. The polishing may primarily remove the isolating material 106 and may stop or be stopped generally when the tops 204 of the pillars 102 are reached.

Figure 3:
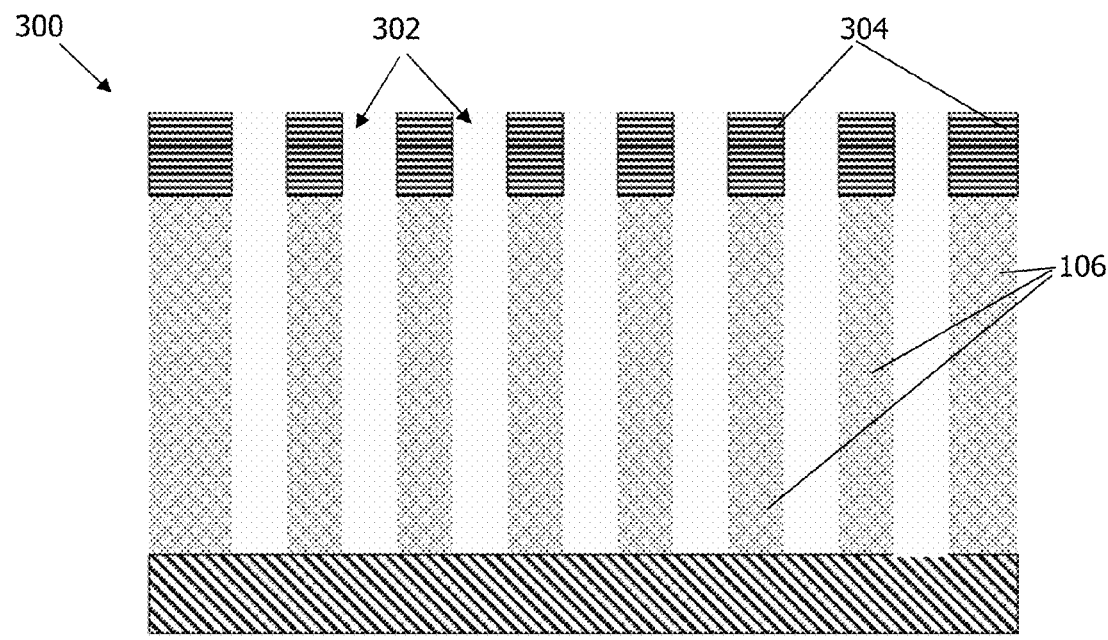
FIG. 3 illustrates isolation layer patterning to generate pillar holes.
Figure 4:
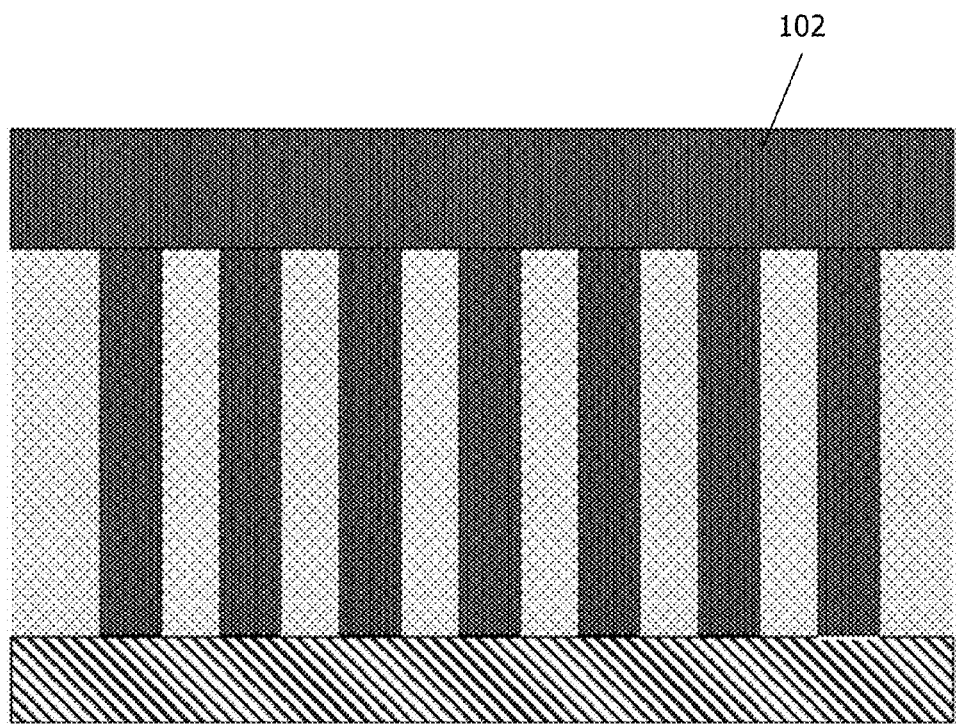
FIG. 4 illustrates the fill of holes with a pillar material

FIGS. 3 and 4 illustrate an alternative embodiment 300 in which the isolating material 106 is first deposited and, using photolithographic patterning techniques and chemical etching, holes 302 are defined and etched therein. An etch-stop material 304 may be used to prevent portions of the isolating material 106 from being removed. As shown in FIG. 4, the holes 302 may be subsequently filled with the pillar material 102. A top surface of the structure 300 may then be polished by CMP to produce the structure 200 depicted in FIG. 2. In this case, however, the polishing is performed primarily upon the pillar material 102 and stops or is stopped generally when a top surface of the isolating material 106 is reached. This halt to the process may be achieved either by timing the polishing process or by selecting a polishing agent (e.g., polishing slurry and polishing pad) that polishes a primary material (e.g., the pillar material 102) selectively to a secondary material (e.g., the isolating material 106). In other words, the polishing process may polish the primary material at a greater rate than the secondary material so as to effectively stop, or significantly slow down, when the secondary material becomes exposed. Slurries or polishing agents having material selectivity are well known and understood by those skilled in the art of CMP. Typically, depositing the isolating material 106 first and then etching and filling the pillar holes is less desirable because of the difficulty in patterning and etching very small (e.g., critical dimension) holes and filling such small holes without forming voids.

Figure 5:
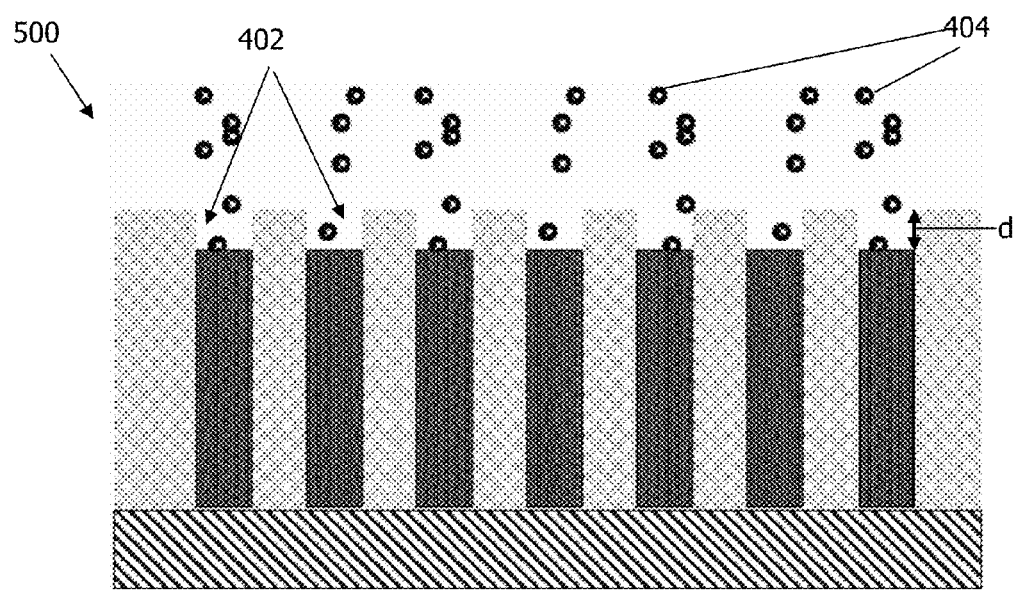
FIG. 5 illustrates the pillar etching process and the formation of recesses.
Figure 6:
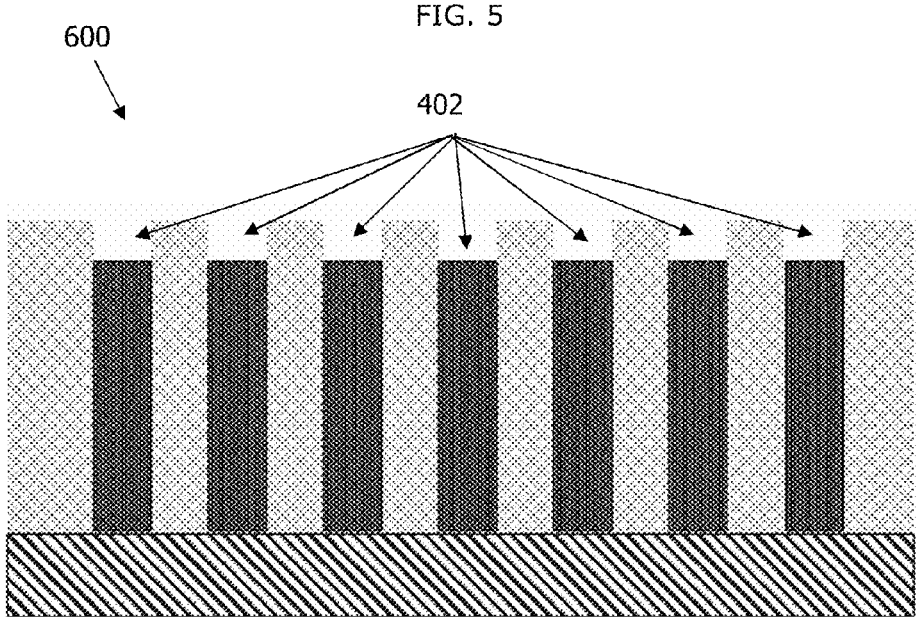
FIG. 6 illustrates recess creation without an etch-stop layer.

FIGS. 5 and 6 illustrate the formation of recesses 402 of depth d in the structure 500 by using a maskless (e.g., self-aligned) selective pillar etch 404. The etch is selective, etching the pillar material 102 more rapidly than the surrounding insulating material 106. Etches having material selectivity are well known and understood by those skilled in the art of chemical etching. For example, a chlorine-based RIE etch may etch the pillar material 102 (which may include or consist of silicon, polysilicon, and/or amorphous silicon) approximately ten times or faster than the surrounding insulating material 106 (which may include or consist of silicon dioxide). This self-aligned etching process enables the creation of the recesses 402 without additional masking or material layers and without additional photolithographic steps. FIG. 6 illustrates a structure 600 having recesses 402 formed by the above-described process.

Figure 7:
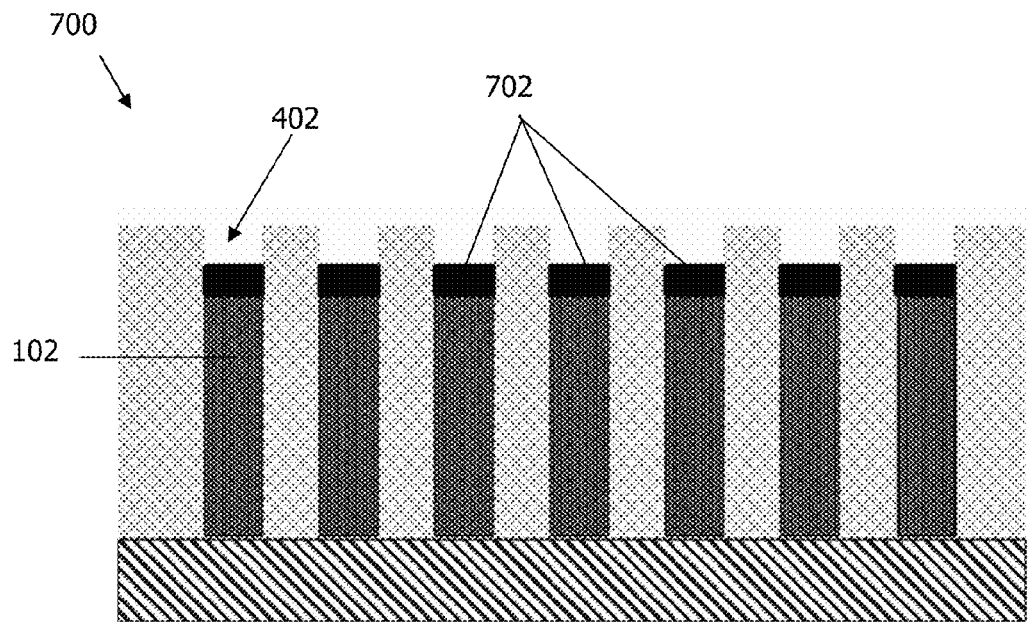
FIG. 7 illustrates recess creation with an etch-stop layer.

FIG. 7 illustrates, in one embodiment, a structure 700 having an etch stop layer 702 on each pillar 102. The recesses 402 may be created at many different points across a die or wafer, and controlling the etching process across such a large area to produce recesses 402 of similar depth may be difficult. Accordingly, the etch-stop layer 702 may permit greater control of the recess 402 depth across the die and/or wafer by providing a stopping point for the etch chemistry, such that all pillars 102 are etched to a similar or substantially identical depth. In one embodiment, a multi-layer stack is deposited during the creation of the pillars 102 to facilitate formation of the etch-stop layer 702. For example, referring also to the structure 300 shown in FIG. 3, a lower portion of the pillars 102 may be formed by epitaxially depositing silicon in the holes 302 in the isolating material 106. The epitaxial process may be finely controlled to produce pillars 102 of a known height. The etch-stop layer 702 (e.g., a silicon dioxide layer) may then be formed on the epitaxially deposited silicon, and an additional amorphous or polycrystalline silicon layer may be formed on the etch-stop layer 702. The thickness of the additional amorphous or polycrystalline silicon layer may be approximately equal to the desired depth of the recesses 402, and may be removed in later processing steps to form recesses 402 having the desired depth. The thickness of the additional amorphous or polycrystalline silicon layer may allow for some over-polishing that would otherwise reduce the depth of the recess 402, as is well known and understood to those skilled in the art.

In one embodiment, the etch-stop layer 702 is formed based on the structure 100 of FIG. 1. In this embodiment, the pillar material is first deposited, and layers of the etch-stop material 702 and additional amorphous or polycrystalline silicon are deposited thereon. The layer stack may thereafter be patterned to form pillars 102 (that include the etch stop-material 702) separated by the isolation material 106. The etch-stop material 702 may then be used in an etching process to produce the recesses 402, as described above.

Figure 8:
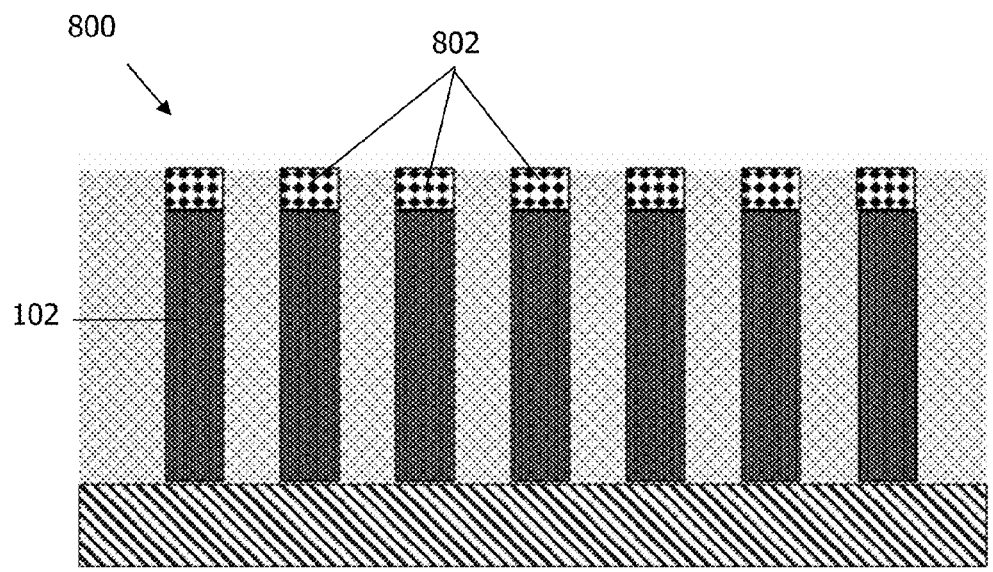
FIG. 8 illustrates the formation of a memory element.

FIG. 8 illustrates use of the structures described above to form data-storage elements. As illustrated, a structure 800 includes a data-storage material 802 (e.g., a phase-change alloy) deposited on the pillars 102 in the recesses 402. The data-storage material 802 makes an electrical connection with the semiconductor material in the pillar 102, thereby operating in series with the diode formed by the pillar 102 and the substrate 104 to provide an information storage device. The data-storage material 802 may be any material having a memory or information-retaining property, such as a resistive change material or a phase change material (such as a chalcogenide alloy or an ovonic alloy). The data storage material 802 may function as a switch in the memory cell.

In one embodiment, a spacer layer (not shown) is formed within a recess 402 prior to deposition of the data-storage material 802. The spacer layer is similar to spacers formed about the gate of an FET transistor and well known to those skilled in the art. The spacer may be formed by conformally depositing a spacer material (e.g., an insulator such as silicon dioxide or silicon nitride) in a recess 402. The spacer material is thereafter etched back, thereby removing it from the wafer surface and the bottom of the recess, while leaving a portion of the spacer material on the sidewalls of the recess 402. The presence of the spacer layer causes the later-deposited data-storage material 802 to have a smaller cross-sectional area, thus concentrating any current passing therethrough and creating a higher effective current density during device operation.

Figure 9:
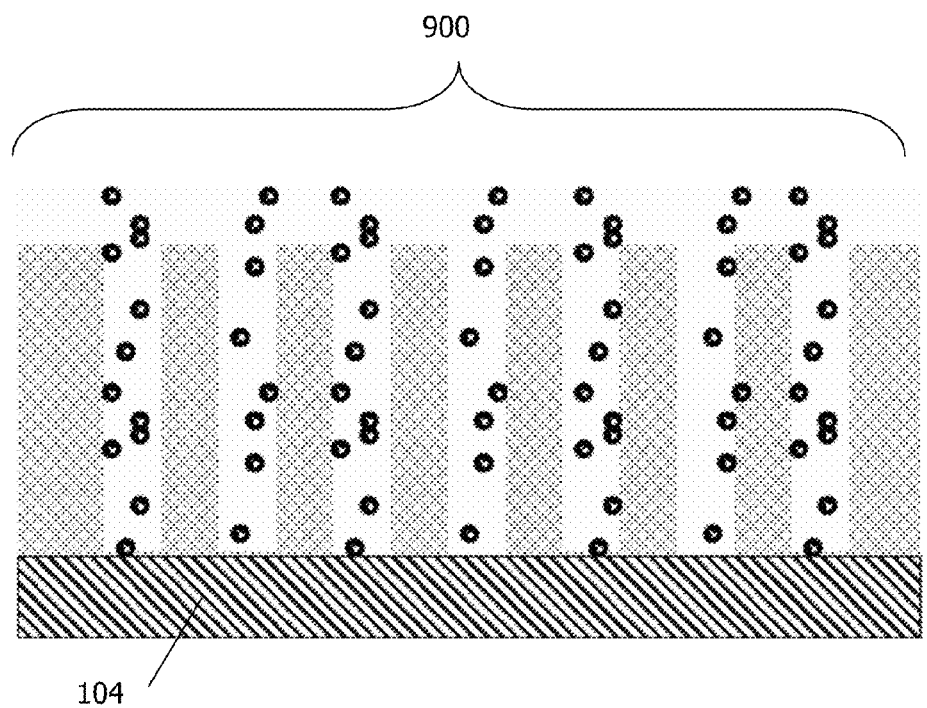
FIG. 9 illustrates the complete etch of a pillar.
Figure 10:
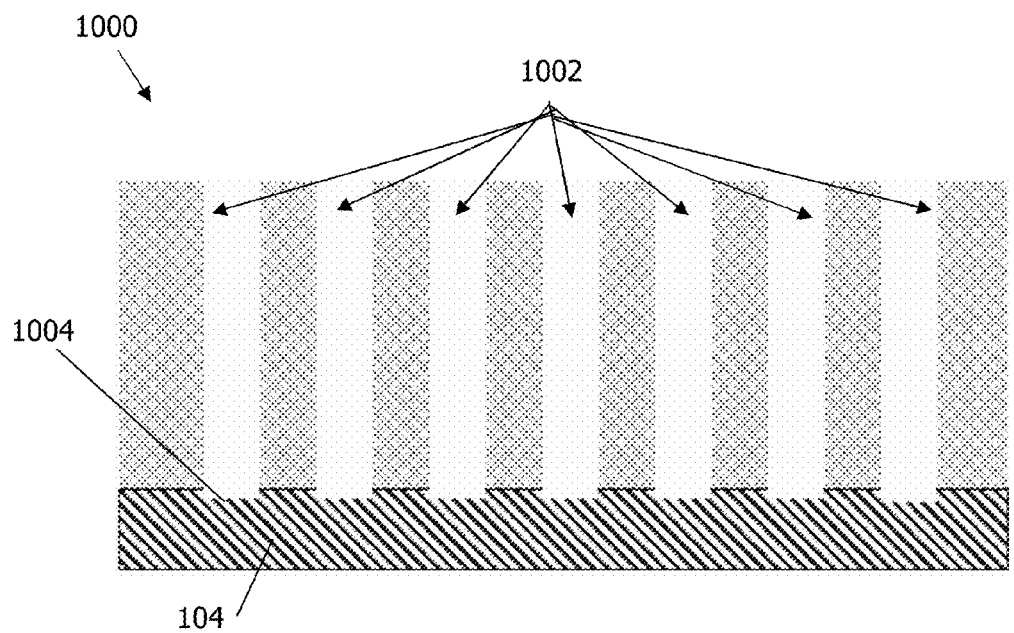
FIG. 10 illustrates via holes formed in pillar holes.
Figure 11:
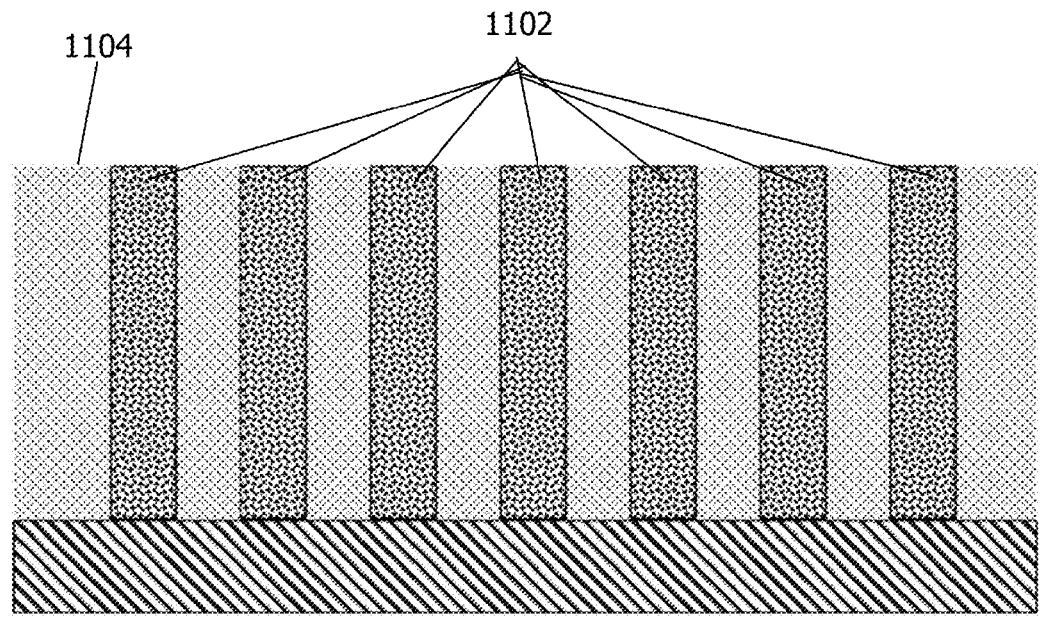
FIG. 11 illustrates a contact made by filling the via with a conductive film.

In other embodiments, shown in FIGS. 9-13, an expanded version of the pillar etch (as described above) may be used to simultaneously form other components, such as contact vias, address decoder diodes, and/or conventional diodes (i.e., diodes without data-storage material). For example, as shown in FIGS. 9-11, contact vias may be formed by masking (i.e., covering, typically using a large-geometry, non-critical photolithographic mask) a first area (not shown) of the substrate 104 where memory storage cell diodes and conventional diodes are to be formed and thereafter etching a second, unmasked area 900 of the substrate 104, as illustrated in FIG. 9. FIG. 10 shows the etched structure 1000, in which those pillars 102 where vias are to be created are etched entirely away to form deep recesses 1002, thereby exposing a top surface 1004 of the substrate 104. FIG. 11 illustrates the deep recesses 1002 filled in by vias 1102 formed by, for example, a damascene metal process that returns the surface 1104 to a planar condition. Other components (such as address decoders, conventional diodes, and/or memory cells) may use one or more adjacent vias 1102 to make an electrical connection to a portion of the component disposed below the surface 1104 and not otherwise accessible. Upper metal layers may make an electrical connection to a top surface of a via 1102 adjacent to a component to connect the component to other circuits on the wafer or die.

In one embodiment, the pillar material is not totally removed (i.e., a surface 1004 of the substrate 104 is not exposed) before the formation of a via 1102. Instead, only enough of the pillar material is removed so that the pillar 102 is not large enough to form a rectifying junction with the substrate 104 or other layer. In other words, the etch proceeds to a point on the pillar 102 below a potential rectifying junction. The remaining portion of the pillar 102 thus forms a simple ohmic contact to a conductive material in the substrate 104. Allowing a small portion of the pillar 102 to remain may decrease the cost, complexity, and/or failure rate of this etching step.

Figure 12:
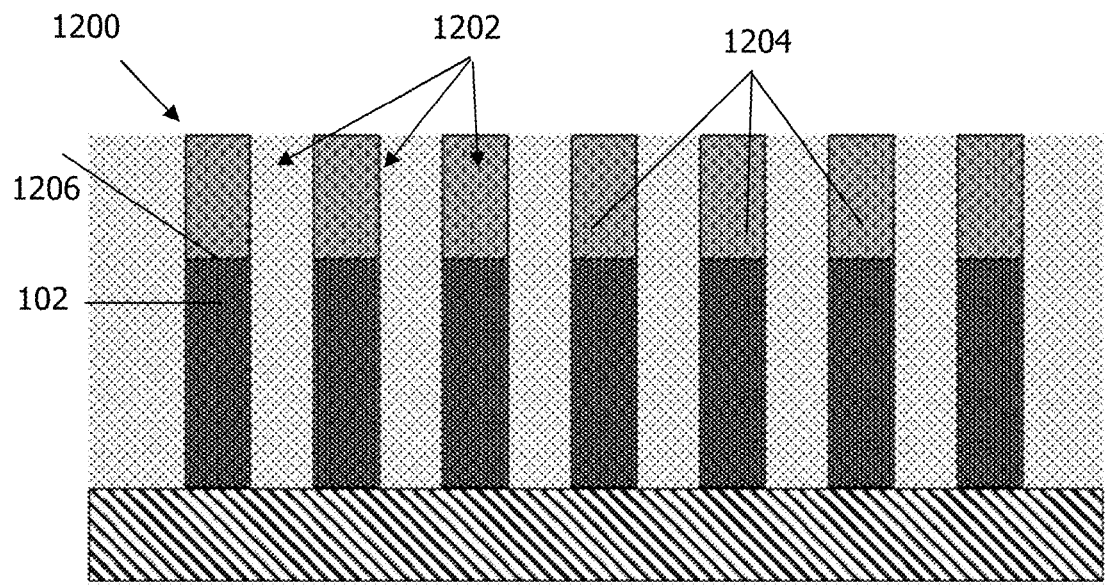
FIG. 12 illustrates the formation of a conventional diode device.

FIG. 12 illustrates a structure 1200 that includes non-storage-element (i.e., conventional) p-n and/or p-i-n junction diodes 1202. The conventional diodes 1202 may be used in a variety of circuit applications, such as in memory-cell current-steering devices. The conventional diodes 1202 may be formed by depositing or doping a semiconductor material 1202 into the recesses 402 on top surfaces 1206 of the pillars 102. In one embodiment, the pillar 102 is an n-type semiconductor and the deposited or doped material 1202 is p-type; in another embodiment, the pillar 102 is p-type and the deposited or doped material 1202 is n-type. An insulator layer (not shown) may be formed between the p-type and n-type semiconductor material to create a p-i-n diode. For example, the substrate 104 may include $n^+$-type silicon and the pillar 104 may include intrinsic silicon. Prior to deposition of the data-storage material 802, an ion implantation step may dope the top portion 1202 of the intrinsic silicon pillar 102 to form $p^+$-type material, thereby creating a p-i-n diode.

In one embodiment, a conventional diode 1202 is masked during later processing steps to preserve its standard p-n or p-i-n structure. Alternatively, a top portion of a conventional diode 1202 may be partially etched and the resulting opening be filled with a conductive material (such as metal); both cases result in a diode-like rectifying contact.

The conventional diodes 1202 may be combined in an address-decoder array in a PCRAM memory. In one embodiment, the address-decoder array receives an encoded address and enables one of a plurality of array bit or word lines, thereby selecting an element in a storage array. The storage element may be the data-storage material 802, described above, and its underlying diode.

Figure 13:
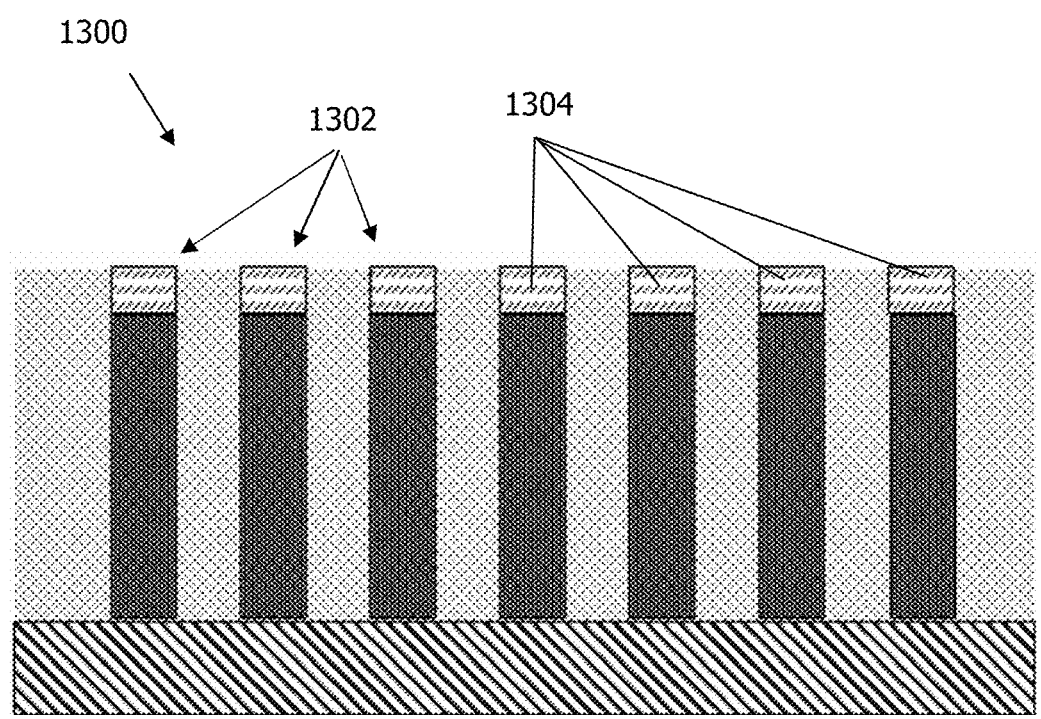
FIG. 13 illustrates a decoding element.

FIG. 13 illustrates a structure 1300 that includes address decoder diodes 1302 formed in accordance with an embodiment of the invention. The storage material 802 is deposited in all exposed recesses 402, as described above, corresponding to the address decoder diodes 1302, conventional diodes 1202, and/or memory cell diodes 800. The address decoder diodes 1302 and conventional diodes may not require the storage material 802, however, and it may be removed from the recesses 402 corresponding to those devices. In one embodiment, the areas of the substrate 104 corresponding to the vias 1102 and/or the memory storage cells 800 are masked, and an appropriate etching step is performed to remove the unmasked storage material 802. The mask is thereafter removed, and a metal layer 1304 may be deposited that fills the newly-etched recesses 402 corresponding to the address decoder 1302 and conventional diodes 1202 to make contact therewith. The deposited metal may also contact the memory cells 800 and vias 1002 and thereafter patterned and etched to form circuit interconnects.

As one skilled in the art will realize, the order of formation of memory cells 800, address decoder diodes 1302, conventional diodes 1202, and vias 1102 may be altered, and is not critical to the present invention. All or some of these components may be created and connected without adding critical-dimension photolithography masks, in accordance with embodiments of the invention.

Table 1 shows an exemplary ten-mask process flow for fabricating a memory device as described above. The photomask steps listed herein, and the order in which they occur, are not meant to be limiting, and other steps, in accordance with embodiments of the invention, are contemplated. The steps are described using photolithography, but other kinds of lithography (such as imprint or e-beam lithography) may be used instead of or in addition to photolithography.

TABLE 1

Ten-Mask Process Flow

| Photomask Number | Name | Description | Usage |
|---|---|---|---|
| 1 | STI | Shallow Trench Isolation | Define active area |
| 2 | GATE | Transistor Gate | Define NMOS transistor gate |
| 3 | VP | Vertical Pillar | Define vertical pillars |
| 4 | DPE | Decoder Pillar Etch | Define areas protected during decoder element etch |
| 5 | CT | Contact | Define areas where pillars will be completely etched |
| 6 | M1 | Metal 1 | Define electrical conduction paths in first level |
| 7 | V1 | Via 1 | Define areas protected during via hole etch |
| 8 | M2 | Metal 2 | Define electrical conduction paths in second level |
| 9 | PAD | Bondpad Open | Define areas protected during the isolation layer etch |
| 10 | M3 | Metal 3 | Define areas protected during the conductive layer etch |

In a first photomask step, shallow-trench isolation regions are created to define the active areas of a silicon wafer using one of many available photolithographic patterning or printing techniques, such as contact printing, proximity printing, or projection printing (including non-optical methods such as extreme-UV lithography). The silicon wafer is etched to create trenches that are filled with an isolating material such as silicon dioxide. Once filled, some or all of the remaining material above the surface is removed by dry etching, wet etching, and/or chemical mechanical polishing. The silicon dioxide in the trenches isolates device elements on the die. This process is known as shallow trench isolation ("STI").

In a second photomask step, a layer is grown or deposited on the substrate to be used as a transistor gate. The thickness of this material may be dependent on the operating characteristics of the transistors to be used in the memory device. Thereafter, a layer of amorphous silicon, crystalline silicon, polycrystalline silicon, or other suitable electrode material is deposited on the transistor gate material. The resulting structure is patterned using photolithography and etched to form a transistor gate. The gate is then encapsulated by an isolating material deposition. This layer is typically thinner than the thickness of the transistor electrode and is subsequently etched. Because the thickness is less than that of the electrode, a fence may remain along the sidewall of the electrode, thereby forming spacers. After spacer formation, the wafer undergoes a doping step which may be performed, for example, by ion implantation. After doping, the wafer undergoes a thermal cycle of sufficiently high temperature that the dopant species interstitially substitutes an atom in the substrate. The dopant species to be chosen is dictated by the operational characteristics desired and the resultant material resistivity required for transistor operation, thereby forming a highly doped drain ("HDD"). Once the HDD doping is completed, a second doping, known as lightly doped drain ("LDD") doping, is used to improve the transistor operational characteristics by increasing the resistivity between the gate and drain interface. Another layer, such as amorphous silicon, epitaxial silicon, polycrystalline silicon, and/or silicon dioxide, is then deposited. After deposition, a CMP step is performed to remove the topography generated by the existing transistor elements and the deposition.

In a third photomask step, the pillars 102 are formed. After the CMP step described above, a photolithography step is used to print structures on the wafer that are thereafter etched to generate the pillars 102. The area surrounding the pillars 102 is then filled with an isolating layer 106, such as high-density plasma ("HDP") oxide and subsequently polished (e.g., by CMP) to form a co-planar surface between the pillars 102 and the surrounding isolation material 106.

In a fourth photomask step, the planar surface is processed through another photolithography step to cover and protect active memory elements 802 from subsequent etch processes, which may partially etch the exposed pillars 102. A fifth photomask step covers all active memory elements and partially etched pillars. An etch step then etches the pillars 102 that are exposed to create vias 1102. Next, all of the protective photomasking layer(s) is/are removed to fill or overfill the partially and completely etched pillars with a conductive film(s) to create layer-to-layer electrical contacts. The conductive film may then be processed with a CMP step to remove conductive film on the wafer surface, such that the conductive film remains only in the locations required for proper device electrical connection.

After the CMP step, an etch is used to partially etch the exposed memory element pillars. The pillar recesses or voids are then filled with an isolating material such as silicon nitride and subsequently etched to form a spacer fence surrounding the recess. This spacer reduces the cross-sectional area of the recess. A reversible memory storage material such as a phase change alloy is then deposited to fill the remaining void above the memory element pillar. The wafer is then polished to remove memory-element material from the wafer such that the conductive film remains only in the locations required for proper device electrical connection.

In a sixth photomask step, an isolating material deposited on the wafer is patterned and etched to define trenches that will be filled with a conductive film such as tantalum and/or copper. The wafer may then be polished (e.g., by CMP) to remove the conductive film above the surface of the isolating layer to form first-level electrical conduction paths ("Metal 1") between the memory elements, decoding elements, contacts, and/or transistor elements. This process is known as damascene metallization.

In a seventh photomask step, if additional conduction paths are required, another layer of isolating film may be deposited, printed, and etched to create via holes or contacts. These holes may then be filled with conductive film such as copper and/or tungsten to form electrical contacts or vias/plugs. In an eighth photomask step, an isolating layer is deposited, patterned, etched filled with conductive film, and polished (e.g., by CMP) to produce a second planar level of electrical conduction paths ("Metal 2"). The Metal 2 layer may connect to the "Metal 1" layer through the vias to allow additional connectivity to device elements. This process can be replicated multiple times depending on the desired operating characteristics.

In a ninth photomask step, for the final planar level, an isolating layer is deposited, masked, etched, and filled with a conductive film such as aluminum and/or an aluminum-copper alloy. In a tenth photomask step, the conductive film is patterned and etched to provide an electrical conduction path between it and the underlying conductive film. This process is typically referred to as "bondpad" because it creates a layer to allow bonding of wiring between the operational memory device and the instrument being used to access the memory device.

Table 2 shows, in an alternative embodiment, an eight-mask process flow for fabricating a memory device as described above. The eight-mask process flow eliminates the seventh and eighth photomask steps from the above-described ten-mask process flow (the formation of Metal 1-to-Metal 2 vias and of Metal 2, respectively) but is otherwise similar.

TABLE 2

Eight-Mask Process Flow

| Photomask Number | Name | Description | Usage |
|---|---|---|---|
| 1 | STI | Shallow Trench Isolation | Define active area |
| 2 | GATE | Transistor Gate | Define NMOS transistor gate |
| 3 | VP | Vertical Pillar | Define vertical pillars |
| 4 | DPE | Decoder Pillar Etch | Define areas protected during decoder element etch |
| 5 | CT | Contact | Define areas where pillars will be completely etched |
| 6 | M1 | Metal 1 | Define electrical conduction paths in first level |
| 7 | PAD | Bondpad Open | Define areas protected during the isolation layer etch |
| 8 | M3 | Metal 3 | Define areas protected during the conductive layer etch |

Having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for forming a non-volatile rewritable memory device, the method comprising:
    over a conductive material, forming pillars of material surrounded by isolating material;
    forming substantially coplanar top surfaces of the pillars and the isolating material;
    at a first plurality of pillar locations, simultaneously etching the pillar material and the isolating material, the pillar material being etched at a greater rate than the isolating material to form recesses over the pillars;
    at the first plurality of pillar locations, filling the recesses and forming circuit elements including the filled recesses, each circuit element comprising a rectifying junction;
    at a second plurality of pillar locations different from the first plurality of pillar locations, simultaneously etching the pillar material and the isolating material, the pillar material being (i) etched at a greater rate than the isolating material and (ii) at least partially removed to form recesses;
    at the second plurality of pillar locations, filling the recesses with a conductor to form pillars each having an ohmic conductive path to the underlying conductive material; and
    over at least the second plurality of pillar locations, forming a layer of a second conductive material, the pillars in the second plurality of pillar locations forming via-connections between the second conductive material and the underlying conductive material.

2. The method of claim 1, wherein the substantially coplanar top surfaces are formed by polishing.

3. The method of claim 1, wherein the circuit elements comprise a non-volatile memory cell.

4. The method of claim 1, wherein the circuit elements comprise a diode.

5. The method of claim 1, wherein etching at the first plurality of pillar locations comprises reactive-ion etching.

6. The method of claim 5, wherein reactive-ion etching comprises chlorine etching.

7. The method of claim 1, wherein the pillars of material comprise at least one of silicon, amorphous silicon, or polysilicon.

8. The method of claim 7, wherein forming the pillars of material comprises epitaxial deposition.

9. The method of claim 1, wherein the isolating material consists essentially of a dielectric.

10. The method of claim 1, further comprising, at a third plurality of pillar locations different from both the first and second pluralities of pillar locations, forming a rectifying junction within each pillar.

11. The method of claim 10, wherein the rectifying junctions within pillars in the third plurality of pillar locations are formed by dopant implantation.

12. The method of claim 1, wherein the rectifying junctions at the first plurality of pillar locations are formed by dopant implantation.

13. A method for fabricating an electronic device, the method comprising:
    forming an array of pillars over a conductive material, each pillar comprising a diode material and being substantially surrounded by an insulating material;
    planarizing the array of pillars to expose a top surface of each pillar;
    at a first plurality of pillar locations, removing an upper portion of each pillar to form a recess thereover; and
    forming a phase-change material within each recess in the first plurality of pillar locations;
    at a second plurality of pillar locations different from the first plurality of pillar locations, removing at least an upper portion of each pillar to form a recess;
    forming a conductor within each recess in the second plurality of pillar locations, to thereby form pillars each forming an ohmic conductive path to the underlying conductive material; and
    over at least the second plurality of pillar locations, forming a layer of a second conductive material, the pillars in the second plurality of pillar locations forming via-connections between the second conductive material and the underlying conductive material.

14. The method of claim 13, wherein each pillar comprises an etch-stop layer, and the step of removing an upper portion of each pillar in the first plurality of pillar locations comprises exposing the etch-stop layer.

15. The method of claim 13, wherein the phase-change material comprises a chalcogenide alloy.

16. The method of claim 13, further comprising forming a spacer within each recess in the first plurality of pillar locations before forming the phase-change material.

17. The method of claim 16, wherein the spacer comprises an insulating material.

18. The method of claim 13, wherein the diode material comprises silicon.

* * * * *